United States Patent
Chen et al.

(10) Patent No.: US 9,823,574 B2
(45) Date of Patent: Nov. 21, 2017

(54) LITHOGRAPHY ALIGNMENT MARKS

(71) Applicant: Taiwan Semiconductor Manufacturing Company, Ltd., Hsin-Chu (TW)

(72) Inventors: Ching-Huang Chen, New Taipei (TW); Hung-Chang Hsieh, Hsin-Chu (TW); Kuei-Liang Lu, Hsinchu (TW); Ya Hui Chang, Hsinchu (TW); Spencer Lin, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/868,532

(22) Filed: Sep. 29, 2015

(65) Prior Publication Data

US 2017/0090299 A1    Mar. 30, 2017

(51) Int. Cl.
| | |
|---|---|
| *H01L 23/544* | (2006.01) |
| *G03F 7/20* | (2006.01) |
| *G03F 9/00* | (2006.01) |
| *H01L 21/66* | (2006.01) |

(52) U.S. Cl.
CPC ...... *G03F 7/70141* (2013.01); *G03F 7/70633* (2013.01); *G03F 9/7076* (2013.01); *H01L 22/12* (2013.01); *Y10S 438/975* (2013.01)

(58) Field of Classification Search
CPC ........... H01L 2223/54426; H01L 22/12; H01L 23/544; H01L 2223/5446; G03F 7/70633; G03F 1/36; G03F 1/42; G03F 7/70191; G03F 7/70441; G03F 7/70608
See application file for complete search history.

(56) References Cited

U.S. PATENT DOCUMENTS

| | | |
|---|---|---|
| 6,297,876 B1 | 10/2001 | Bornebroek |
| 6,921,916 B2 | 7/2005 | Adel et al. |
| 6,961,116 B2 | 11/2005 | Den Boef et al. |
| 7,626,245 B2 | 12/2009 | Tsai et al. |
| 8,692,393 B2 | 4/2014 | Tsai |
| 8,716,841 B1 | 5/2014 | Chang et al. |
| 8,736,084 B2 | 5/2014 | Cheng et al. |
| 8,837,810 B2 | 9/2014 | Chen et al. |
| 9,024,456 B2 | 5/2015 | Yang et al. |
| 2003/0021465 A1* | 1/2003 | Adel ................ G03F 7/70633 382/151 |
| 2009/0096116 A1* | 4/2009 | Yang .................... G03F 9/7076 257/797 |
| 2011/0085726 A1 | 4/2011 | Den Boef et al. |

(Continued)

*Primary Examiner* — Allen Parker
*Assistant Examiner* — Frederick B Hargrove
(74) *Attorney, Agent, or Firm* — Haynes and Boone, LLP

(57) ABSTRACT

A device for semiconductor fabrication includes a substrate and a layer formed over the substrate, wherein the layer includes an alignment mark. The alignment mark includes a first plurality of elongated members that are oriented lengthwise along a first direction and are distributed along a second direction. The alignment mark further includes a second plurality of elongated members that are oriented lengthwise along a third direction perpendicular to the first direction and are distributed along the second direction, wherein the second direction is different from each of the first and third directions.

20 Claims, 8 Drawing Sheets

(56) References Cited

U.S. PATENT DOCUMENTS

| | | | |
|---|---|---|---|
| 2012/0038021 A1* | 2/2012 | Chen | G03F 7/70633 |
| | | | 257/506 |
| 2012/0308112 A1 | 12/2012 | Hu et al. | |
| 2013/0147066 A1* | 6/2013 | Cheng | H01L 22/12 |
| | | | 257/797 |
| 2013/0201461 A1 | 8/2013 | Huang et al. | |
| 2013/0229638 A1 | 9/2013 | Chen et al. | |
| 2014/0101624 A1 | 4/2014 | Wu et al. | |
| 2014/0111779 A1 | 4/2014 | Chen et al. | |
| 2014/0119638 A1 | 5/2014 | Chang et al. | |
| 2014/0123084 A1 | 5/2014 | Tang et al. | |
| 2014/0185028 A1 | 7/2014 | De Boer et al. | |
| 2014/0226893 A1 | 8/2014 | Lo et al. | |
| 2014/0253901 A1 | 9/2014 | Zhou et al. | |
| 2014/0256067 A1 | 9/2014 | Cheng et al. | |
| 2014/0257761 A1 | 9/2014 | Zhou et al. | |

* cited by examiner

LITHOGRAPHY ALIGNMENT MARKS

BACKGROUND

Semiconductor integrated circuit (IC) fabrication involves forming multiple material layers with designed patterns on a semiconductor wafer. Each layer has to be aligned with previous layers such that the formed circuit can function properly. Various marks are used for this purpose. For example, alignment marks are used for alignment between a mask (a photo mask) and a semiconductor wafer. In another example, overlay marks are used to monitor overlay deviation between multiple layers on a wafer. As semiconductor technology continues progressing to circuits having smaller feature sizes, alignment requirements become more stringent. Therefore, it is desirable to have alignment marks that provide high signal intensity and measurement accuracy.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
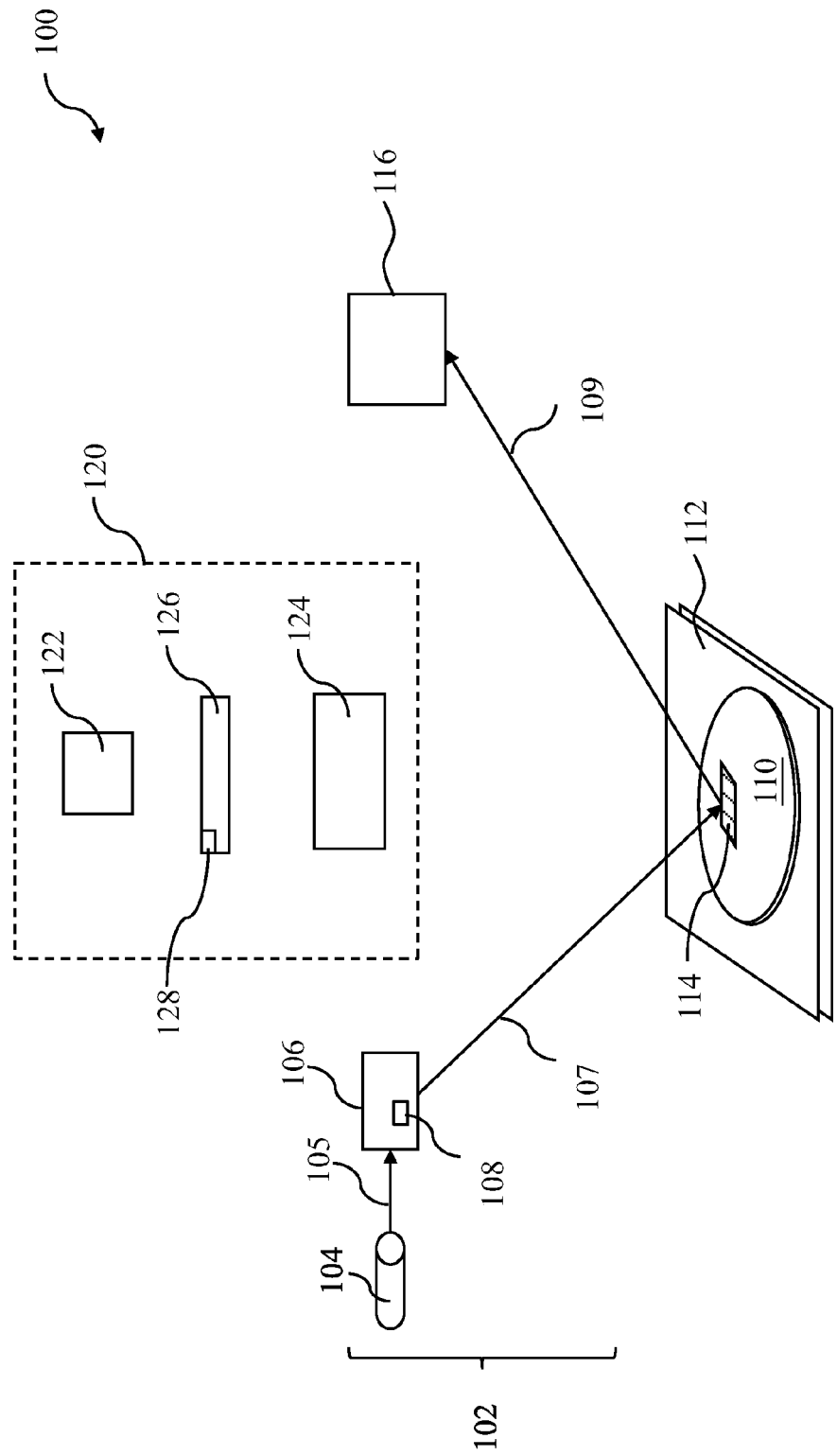
FIG. 1 is a simplified schematic diagram of a lithography system that may benefit from various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices. More particularly, the present disclosure is related to devices (such as wafers) having alignment marks. The alignment marks according to the present disclosure provide strong signal intensity for alignment measurement and, at the same time, provide pattern uniformity for minimizing dishing effects during various fabrication stages such as chemical mechanical planarization (CMP) processes.

FIG. 1 is a schematic view of a lithography system 100 constructed according to various aspects of the present disclosure in one or more embodiments. Referring to FIG. 1, the lithography system 100 includes an alignment sub-system 102 and an exposure sub-system 120. With reference to FIG. 1, the system 100 and the method of utilizing the same to check alignment and to expose circuit patterns are collectively described below.

The alignment sub-system 102 includes a light source 104 that is configured to emit a light beam 105. The light source 104 may be coherent or incoherent. In an embodiment, the light source 104 is capable of emitting a visual light, an infrared light, a near-infrared (NIR) light, a far-infrared (FIR) light, a violet light, a ultra-violet (UV) light, or a combination thereof. In an embodiment, the light source 104 is a laser source such as a solid state laser source, a dye laser source, or another suitable laser source. The light beam 105 may have one or more wavelengths and at least one of the wavelengths is suitable for alignment measurement. For example, the light beam 105 may have a wavelength of 532 nanometer (nm), 633 nm, 780 nm, 850 nm, or a combination thereof.

The alignment sub-system 102 further includes an optical assembly 106. In the present embodiment, the optical assembly 106 includes a light polarizer 108 and other optical components such as lens, mirrors, beam splitters, and/or fiber optics. The optical assembly 106 receives the light beam 105 from the light source 104 and projects a polarized light beam 107 onto a target device 110 (such as a wafer), positioned on a substrate stage 112. In the following discussion, the target device 110 is also referred to as the wafer 110. In an embodiment, the light polarizer 108 includes a linear polarizer which may be an absorptive polarizer or a beam splitting polarizer. For example, the light polarizer 108 may be a wire-grid polarizer, a birefringent beam splitter such as a Glan-Taylor prism or a Wollaston prism, or another suitable linear polarizer.

The polarized light beam 107 is incident upon a mark 114 disposed on the wafer 110. The mark 114 may be an alignment mark or an overlay mark, and may be disposed in a cell region or a scribe line region of the wafer 110. An alignment mark is often used for aligning a wafer (e.g., the wafer 110) and a mask (e.g., a mask 126 to be discussed later). An overlay mark is often used for measuring overlay deviations between two layers on a wafer (e.g., the wafer 110). In the following discussion, the mark 114 is an alignment mark (also referred to as the alignment mark 114). However, various aspects of the present disclosure can be applied to overlay marks as well. In the present embodiment, the alignment mark 114 is a reflection-based alignment mark. Alternatively, the alignment mark 114 may be a diffraction-based alignment mark.

In an embodiment, the substrate stage 112 is operable to move such that the polarized light beam 107 scans through one or more alignment marks 114. The polarized light beam 107 may have an incident angle of 90 degrees or another suitable angle relative to the plane of the alignment mark 114. The light beam 109, which is the polarized light beam 107 reflected off the alignment mark 114, carries imaging information about the alignment mark 114. The light beam 109 is collected by a monitor 116 for alignment or overlay analysis. In an embodiment, the monitor 116 includes light sensors and other optical components such as lens, beam splitters, and/or cameras. The monitor 116 may further include a computer which calculates alignment measurement or overlay measurement. The lithography system 100 may further include an alignment control unit designed to control the alignment based on the alignment measurement.

Still referring to FIG. 1, the exposure sub-system 120 is designed for performing a lithography exposure process to a resist layer coated on the wafer 110. When the exposed resist layer is further developed, various openings are formed in the resist layer, resulting in a patterned resist layer. The wafer 110 may be subsequently etched with the patterned resist layer as an etch mask, thereby forming features therein or thereon for an integrated circuit. In the present embodiment, the exposure sub-system 120 includes a radiation source 122 to provide radiation energy, and an optical module 124 that modulates the radiation energy by the image of a mask 126 and directs the modulated radiation energy to the resist layer coated on the wafer 110.

The radiation source 122 may be any radiation source suitable for exposing a resist layer. In various examples, the radiation source 122 may include a light source selected from the group consisting of ultraviolet (UV) source, deep UV (DUV) source, extreme UV (EUV) source, and X-ray source. For example, the radiation source 122 may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; a Fluoride ($F_2$) excimer laser with a wavelength of 157 nm; or other light sources having a desired wavelength (e.g., below approximately 100 nm). In another example, the light source is a EUV source having a wavelength of about 13.5 nm or less. In an alternative embodiment, the radiation source 122 is an electron beam (e-beam) source for exposing a resist layer by a proper mode, such as direct writing. In such a case, the mask 126 is not used during the exposing processes.

The optical module 124 may be designed to have a refractive mechanism or reflective mechanism. In a refractive mechanism, the optical module 124 includes various refractive components, such as lenses. In a reflective mechanism, the optical module 124 includes various reflective components, such as mirrors.

The mask 126 includes an alignment mark 128, which is used by the lithography system 100 to obtain positional information of the mask 126. The alignment mark 128 may have the same design as the alignment mark 114. The mask 126 is secured on a mask stage which is configured to move such that the image of the mask 126 is projected onto a target area of the wafer 110. The mask 126 and the target area of the wafer 110 are aligned using the alignment marks 114 and 128.

In an embodiment, the mask 126 includes a transparent substrate and a patterned absorption layer. The transparent substrate may use fused silica ($SiO_2$) relatively free of defects, such as borosilicate glass and soda-lime glass. The absorption layer may include a metal film such as chromium (Cr) for absorbing light directed thereon. The absorption layer is further patterned to have one or more openings in the metal film through which a light beam may travel without being completely absorbed. In another embodiment where the radiation source 122 generates EUV radiation, the mask 126 is designed to have reflective mechanism. For example, the mask 126 may include a substrate coated with tens of alternating layers of silicon and molybdenum to act as a Bragg reflector that maximizes the reflection of EUV light.

The lithography system 100 is used for exposing a resist layer coated on the wafer 110. The exposed resist layer is subsequently used for etching the wafer 110 in order to form a material layer with designed IC patterns on the wafer 110. This process repeats, layer by layer, for forming multiple material layers on the wafer 110. The multiple material layers have to be aligned with each other in order for the final IC to function properly. In this fabrication process, the alignment mark(s) 114 (and 128 if applicable) play an important role. In one respect, the alignment accuracy is directly related to the intensity of the reflected light beam 109 as well as the contrast in the image carried by the reflected light beam 109. In various embodiments, the present disclosure provides a design for the alignment mark 114 that maximizes the contrast in the alignment mark images while producing high signal intensity in the reflected light beam 109. In another respect, the alignment mark 114 is subject to potential degradation during various fabrication stages, such as deposition and CMP. For example, when forming a metal layer (e.g., an interconnect layer) of an IC, some alignment marks on the metal layer may be subject to metal dishing effects of CMP, resulting in potential deformation of the alignment mark. Embodiments of the alignment mark 114 according to the present disclosure counter such issues.

Figure 2:
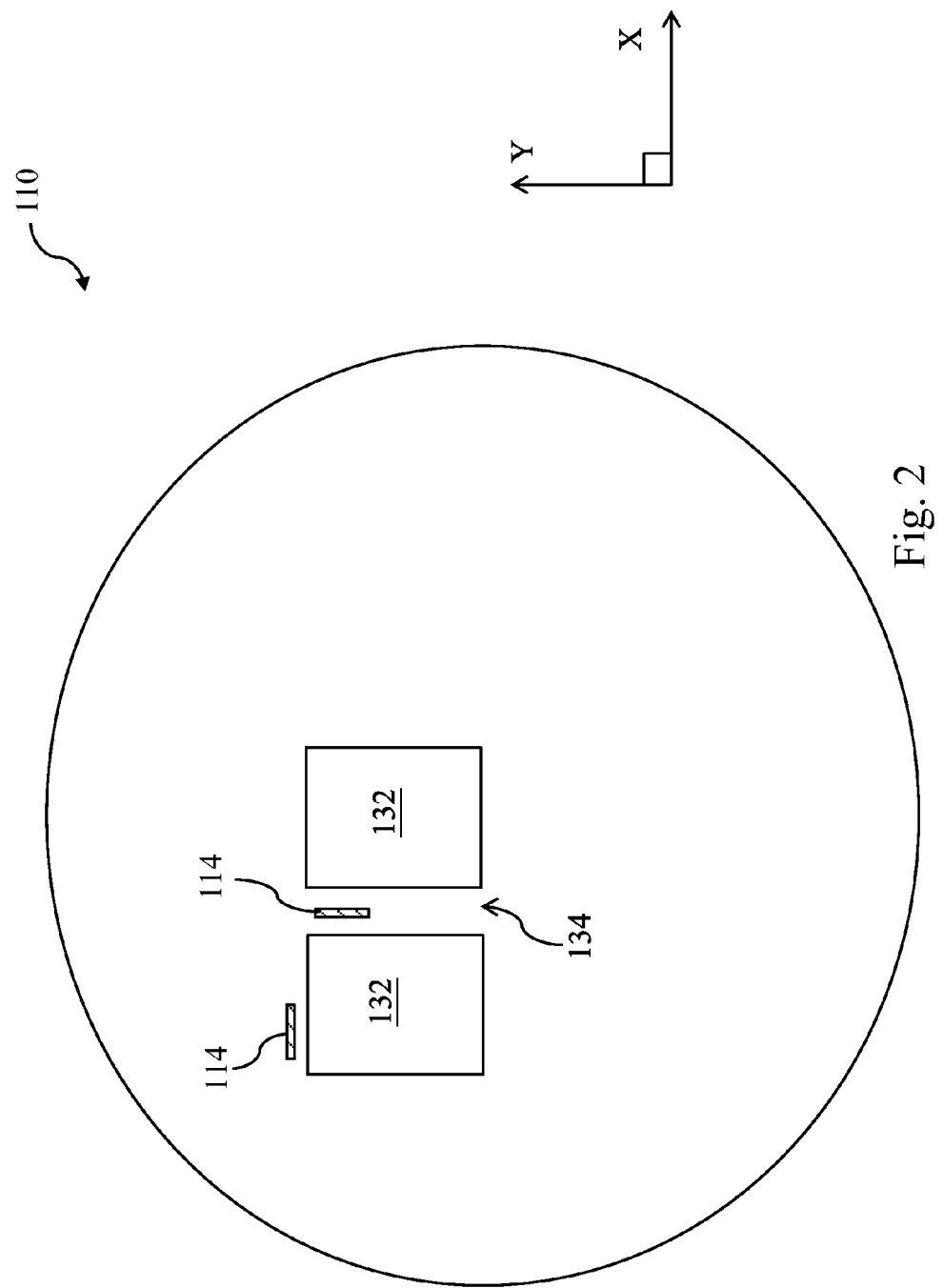
FIG. 2 is a top view of a semiconductor wafer having various marks constructed according to aspects of the present disclosure in one embodiment.

FIG. 2 is a top view of the wafer 110 having various alignment marks 114 constructed according to aspects of the present disclosure. Referring to FIG. 2, in the present embodiment, the wafer 110 includes a plurality of fields having ICs defined therein for one or more dies. During a lithography exposing process, the wafer 110 is exposed one field at a time. For example, the exposing module 120 scans the IC pattern defined in the mask 126 and transfers it to one field, then steps to next field and repeats the scanning until the fields in the wafer 110 are exhausted. Each field includes one or more circuit dies and a frame region at the boundary areas. FIG. 2 illustrates two circuit dies (or chips) 132. Each circuit die 132 includes an IC at its present fabrication stage. Scribe line regions 134 are between the adjacent circuit dies and define the areas where the circuit dies 132 are separated by dicing. FIG. 2 further illustrates two alignment marks 114 disposed in the scribe line regions 134. The number of circuit dies 132 and the number of alignment marks 114 are for illustration purposes only and do not limit the present disclosure. Other marks (e.g., overlay marks or different types of alignment marks) may also be disposed in the scribe line regions 134. Additionally or alternatively, the alignment marks 114 may be disposed in the frame regions defined in the areas between the adjacent fields. In another embodiment, the alignment marks 114 may also be disposed in the circuit regions of the circuit dies 132.

Figure 3:
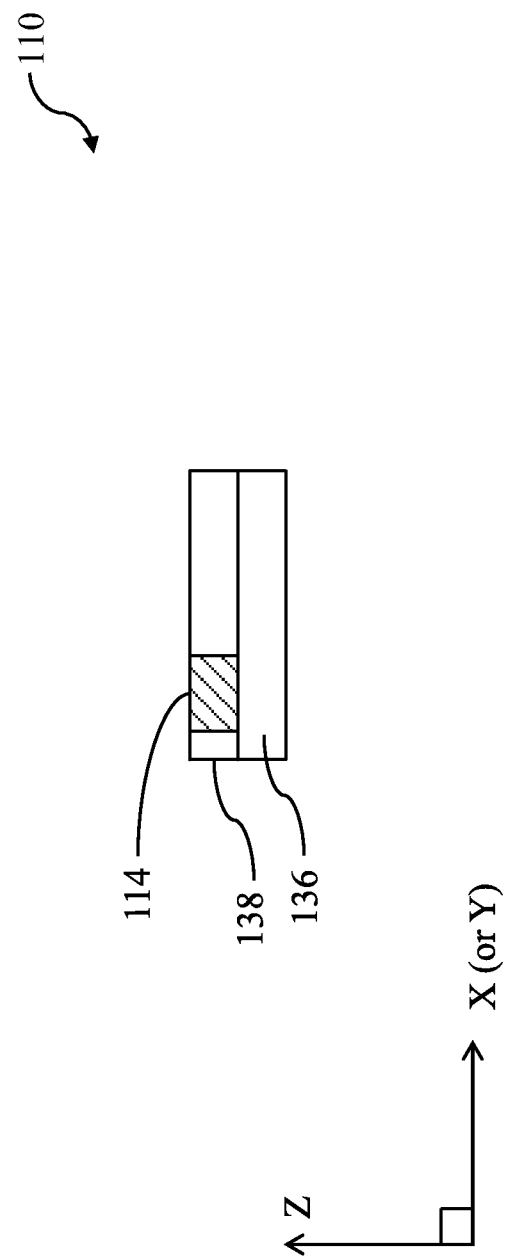
FIG. 3 is a cross-sectional view of a portion of the semiconductor wafer of FIG. 2, in accordance with an embodiment.

FIG. 3 is a cross-sectional view of the wafer 110, in portion, according to aspects of the present disclosure. Referring to FIG. 3, in the present embodiment, the wafer 110 includes a substrate 136 and a material layer 138 formed over the substrate 136. The alignment marks 114 are formed in the material layer 138. The depth (or thickness) of the alignment mark 114 is defined in the Z direction and is generally the same as the rest of the layer 138. In the present embodiment, the alignment marks 114 are marks for aligning the wafer 110 when exposing a resist layer formed over the material layer 138. In another embodiment, the alignment marks 114 may be used for measuring overlay deviations between the material layer 138 and another layer either underneath or above the material layer 138.

In the present embodiment, the substrate 136 includes a semiconductor substrate. In various embodiments, the substrate 136 may include an elementary semiconductor such as crystal silicon, polycrystalline silicon, amorphous silicon, germanium, and diamond; a compound semiconductor such as silicon carbide and gallium arsenic; an alloy semiconductor such as SiGe, GaAsP, AlInAs, AlGaAs, and GaInP; or a combination thereof. Further, the substrate 136 may include one or more material layers therein, and may include passive components such as resistors, capacitors, and inductors; and active components such as p-type FETs (PFETs), n-type FETs (NFETs), fin-like FETs (FinFETs), other three-dimensional (3D) FETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

Figure 4:
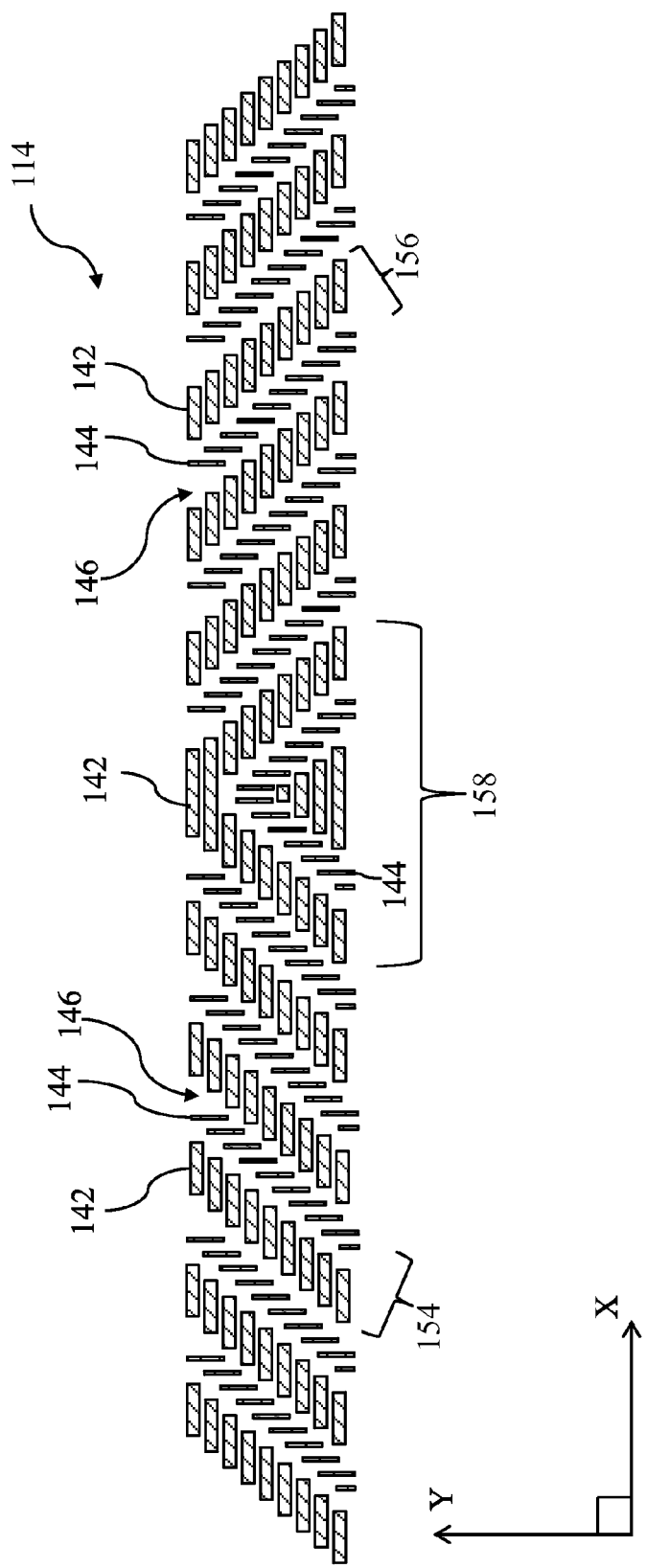
FIG. 4 is a top view of a portion of an alignment mark constructed according to aspects of the present disclosure in one embodiment.

In an embodiment, the material layer 138 is a metal layer, such as a layer having copper interconnect for connecting various active or passive components in the substrate 136. To further this embodiment, the alignment mark 114 comprises metal lines interposed with spaces from a top view. For example, the metal lines may include copper or other suitable metals such as aluminum, and the spaces are filled with a dielectric material such as an extreme low-k (ELK) dielectric material. The term "extreme low-k (ELK)" means a dielectric constant of 2.5 or less. An exemplary ELK dielectric material is carbon doped oxide comprised of Si, C, O, and H (SiCOH) formed by plasma enhanced chemical vapor deposition (PECVD). To strengthen the alignment mark 114 against CMP dishing effects, the metal lines in the alignment mark 114 are segmented. Further, to provide strong signal intensity for alignment measurement, the alignment mark 114 comprises lines oriented at perpendicular directions. FIG. 4 shows an exemplary alignment mark 114, in portion, constructed according to various aspects of the present disclosure.

Referring to FIG. 4, form a top view, the alignment mark 114 is oriented longitudinally along the X direction. In an embodiment, the X direction is the same direction that the polarized light beam 107 scans the alignment mark 114. Throughout this disclosure, the X and Y directions are perpendicular to each other and define the plane of the alignment mark 114. The alignment mark 114 includes a central portion 158, a plurality of portions 154 (five are shown) each tilted clockwise from the Y direction, and a plurality of portions 156 (five are shown) each tilted counterclockwise from the Y direction. The portions 154 are also referred to as the CW portions 154, and the portions 156 are also referred to as the CCW portions 156. The central portion 158 may be viewed as a result of merging one or more CW portions 154 and one or more CCW portions 156. The CW portions 154, the CCW portions 156, and the central portion 158 each include a plurality of elongated members 142 and a plurality of elongated members 144. The members 142 are oriented lengthwise along the X direction, and the members 144 are oriented lengthwise along the Y direction. The various members 142 and 144 are separated by spaces 146. In an embodiment, the various members 142 and 144 include copper and the spaces 146 are filled with an ELK material. The alternating metal and dielectric material help strengthen the alignment mark 114 against dishing effects of CMP. In an embodiment, the electrical field of the polarized light beam 107 is in the X direction, and the members 144, being oriented perpendicular to the electric field, help improve the contrast in the alignment mark images.

Figure 5:
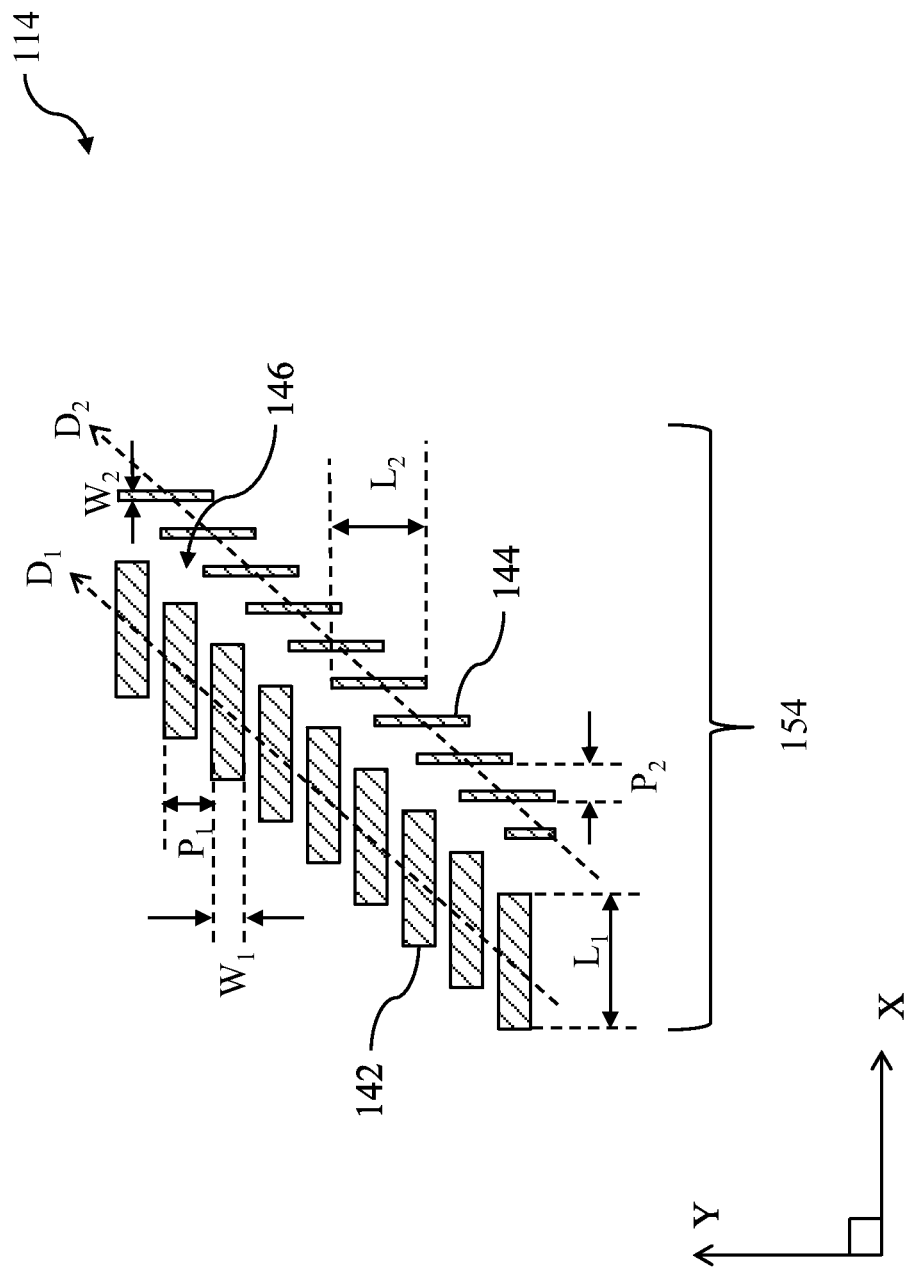
FIGS. 5, 6, and 7 are portions of the alignment mark of FIG. 4, in accordance with some embodiments.

FIG. 5 shows further details of a portion of the CW portion 154. Referring to FIG. 5, the CW portion 154 includes a plurality of elongated members 142 and a plurality of elongated members 144. The numbers of the members 142 and 144 as shown are for illustrative purposes only and do not limit the present disclosure. Further, the number of the members 142 may or may not be equal to the number of the members 144 in various embodiments. In embodiments, each of the members 142 and 144 may have a generally rectangular shape with rounded, pointed, flat, or other shaped ends.

The members 142 are oriented lengthwise in the X direction and are distributed along a direction $D_1$ which is tilted clockwise from the Y direction. The direction $D_1$ is taken along the middle points of each of the members 142 (ignoring any truncated or extended members). In an embodiment, the directions X and $D_1$ form a 45 degree angle. The members 142 each have a length $L_1$ with the understanding that the top-most and bottom-most members may be extended or truncated depending on the location of the alignment mark 114 with respect to the wafer 110 (FIG. 2). The members 142 each have a width $W_1$, and are spaced with a pitch $P_1$. The length $L_1$ is defined in the X direction, while the width $W_1$ and pitch $P_1$ are defined in the Y direction. In an embodiment, the length $L_1$ is about 1.5 micron (μm). In another embodiment, the length $L_1$ is in a range from about 1.4 to about 1.5 μm. The pitch $P_1$ is designed to be smaller than the wavelength of the polarized light beam 107. In one example where the polarized light beam 107 is a red light (e.g., wavelength is about 633 nm), the pitch $P_1$ may be set to about 300 nm. The width $W_1$ is designed according to an image contrast requirement for the alignment mark 114, which will be discussed in more details later. In an embodiment, the width $W_1$ is designed to be greater than half of the pitch $P_1$. For example, when the pitch $P_1$ is about 300 nm, the width $W_1$ may be in a range from about 220 nm to about 240 nm.

The members 142 may be viewed as segmentations of one line, such as a metal line oriented lengthwise along the $D_1$ direction. The scheme of segmentation helps strengthen the alignment mark 114 against degradation during various fabrication stages. For example, when the CW portion 154 comprises a solid line of copper instead of the plurality of members 142, the CW portion 154 might be excessively recessed during CMP because copper is relatively soft. This would result in dishing in the alignment mark 114 and, consequently, poor alignment measurement. With the spaces 146 filled with a dielectric material, the CW portion 154 (accordingly, the alignment mark 114) is strengthened against the potential deformation.

Still referring to FIG. 5, the members 144 are oriented lengthwise in the Y direction and are distributed along a direction $D_2$ which is tilted clockwise from the Y direction. The direction $D_2$ is taken along the middle points of each of the members 144 (ignoring any truncated or extended members). In an embodiment, the directions X and $D_2$ form a 45 degree angle. In the present embodiment, the directions $D_1$ and $D_2$ are the same (parallel to each other). The members 144 each have a length $L_2$ with the understanding that the top-most and bottom-most members may be extended or truncated depending on the location of the alignment mark 114 with respect to the wafer 110 (FIG. 2). The members 144 each have a width $W_2$, and are spaced with a pitch $P_2$. The length $L_2$ is defined in the Y direction, while the width $W_2$ and pitch $P_2$ are defined in the X direction. In an embodiment, the length $L_2$ is about 1.2 µm. In another embodiment, the length $L_2$ is in a range from about 1.0 to about 1.3 µm. The pitch $P_2$ is designed to be smaller than the wavelength of the polarized light beam 107. In one example where the polarized light beam 107 is a red light (e.g., wavelength is about 633 nm), the pitch $P_2$ may be set to about 300 nm. In embodiments, the pitches $P_1$ and $P_2$ are designed to be within 10% of each other. For example, when the pitch $P_1$ is 300 nm, the pitch $P_2$ may be designed in the range from 285 nm to 315 nm. The width $W_2$ is designed according to an image contrast requirement for the alignment mark 114, which will be discussed in more details later. In an embodiment, the width $W_2$ is designed to be smaller than half of the pitch $P_2$. For example, when the pitch $P_2$ is about 300 nm, the width $W_2$ may be set in a range from about 60 nm to about 100 nm.

Figure 6:
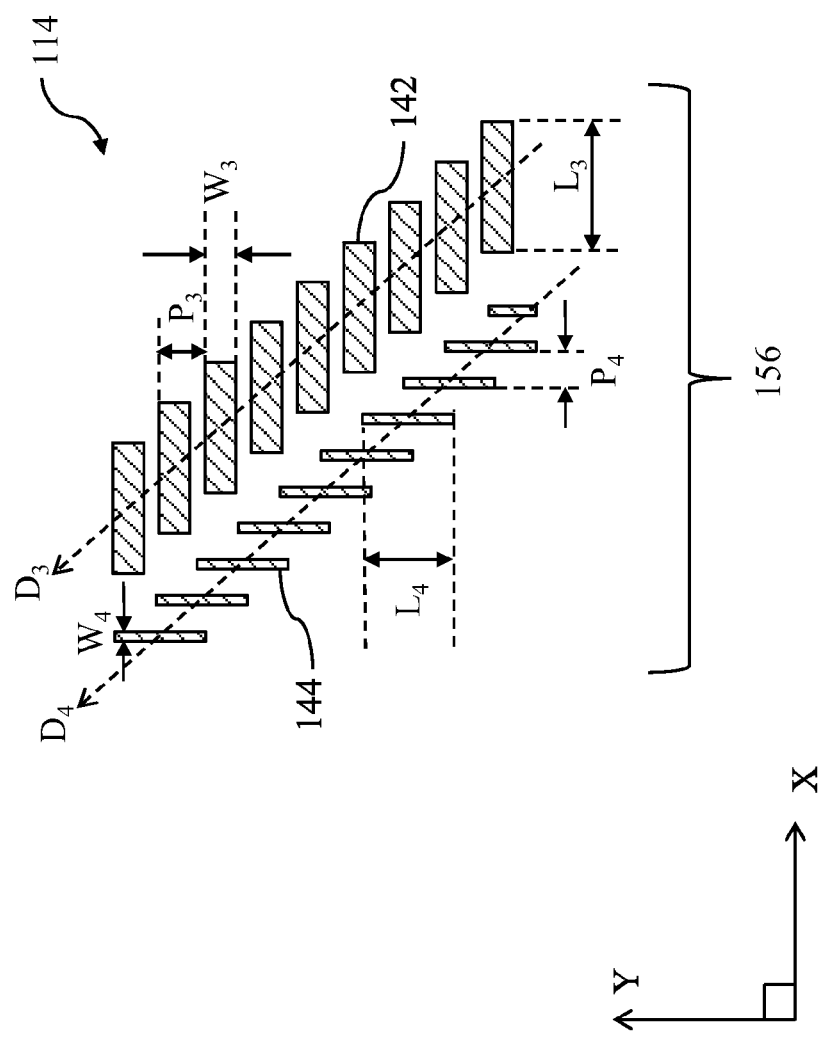

FIG. 6 shows further details of the CCW portion 156. Referring to FIG. 6, the CCW portion 156 includes a plurality of elongated members 142 and a plurality of elongated members 144. The members 142 are oriented lengthwise in the X direction and are distributed along a direction $D_3$ which is tilted counterclockwise from the Y direction. The direction $D_3$ is taken along the middle points of each of the members 142 (ignoring any truncated or extended members). In an embodiment, the directions Y and $D_3$ form a 45 degree angle. The members 142 each have a length $L_3$, a width $W_3$, and are spaced with a pitch $P_3$. In embodiments, the length $L_3$, width $W_3$, and pitch $P_3$ are similar to the length $L_1$, width $W_1$ and pitch $P_1$, respectively. The members 144 are oriented lengthwise in the Y direction and are distributed along a direction $D_4$ which is tilted counterclockwise from the Y direction. The direction $D_4$ is taken along the middle points of each of the members 144 (ignoring any truncated or extended members). In an embodiment, the directions Y and $D_4$ form a 45 degree angle. In the present embodiment, the directions $D_3$ and $D_4$ are the same (parallel to each other). The members 144 each have a length $L_4$, a width $W_4$, and are spaced with a pitch $P_4$. In embodiments, the length $L_4$, width $W_4$, and pitch $P_4$ are similar to the length $L_2$, width $W_2$ and pitch $P_2$, respectively.

Figure 7:
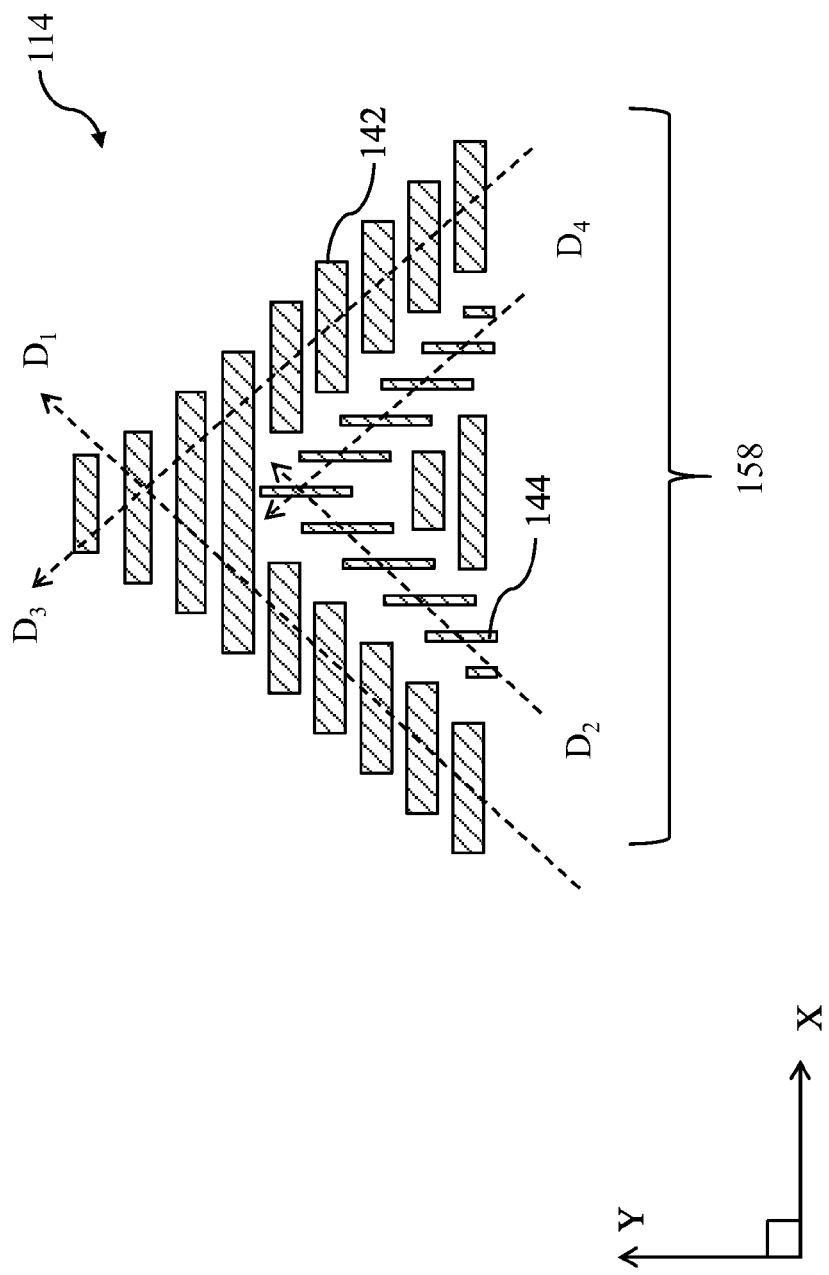

FIG. 7 shows further details of the central portion 158, in portion. Referring to FIG. 7, the central portion 158 may be viewed (or designed) as one or more CW portions 154 merging with one or more CCW portions 156, thereby forming layered triangular shapes. To that respect, the central portion 158 includes a first plurality of members 142 distributed along one side of a first triangle (the $D_1$ direction) and a second plurality of members 142 distributed along another side of the first triangle (the $D_3$ direction). The first and second pluralities of members 142 meet at a vertex of the first triangle. The central portion 158 further includes a first plurality of members 144 distributed along one side of a second triangle (the $D_2$ direction) and a second plurality of members 144 distributed along another side of the second triangle (the $D_4$ direction). The first and second pluralities of members 144 meet at a vertex of the second triangle.

Figure 8:
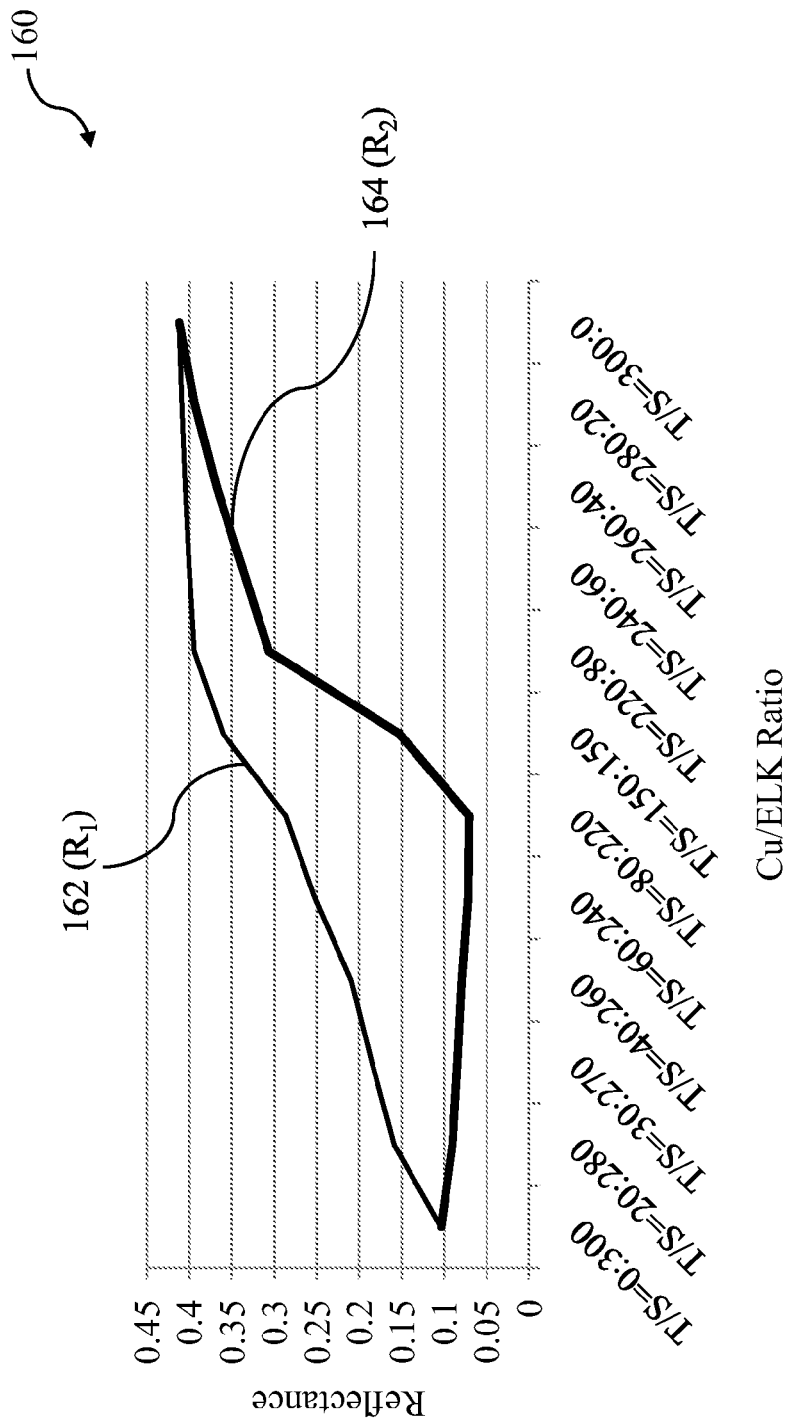
FIG. 8 is a graph of reflectance provided by embodiments of the alignment mark of FIG. 4, in one example.

FIG. 8 shows a graph 160 illustrating the reflectance of the alignment mark 114 as a function of some of the dimensions discussed above. In the example shown, the members 142 and 144 comprise copper and the spaces 146 are filled with an ELK material. Further, the pitch $P_1$ and $P_2$ are set to 300 nm each and the polarized light beam 107 is a red light (wavelength is about 633 nm). Still further, the CW portion 154 and the CCW portion 156 are symmetrical about the Y axis, i.e., the respective widths ($W_1$ and $W_3$, $W_2$ and $W_4$), lengths ($L_1$ and $L_3$, $L_2$ and $L_4$), and pitches ($P_1$ and $P_3$, $P_2$ and $P_4$) are the same between the two portions. Referring to FIG. 8, a curve 162 illustrates the reflectance $R_1$ of the members 142 as a function of the ratio between the width $W_1$ of the copper and the width ($P_1$-$W_1$) of the ELK (i.e., the ratio of the lines to the spaces) in the Y direction. A curve 164 illustrates the reflectance $R_2$ of the members 144 as a function of the ratio between the width $W_2$ of the copper and the width ($P_2$-$W_2$) of the ELK (i.e., the ratio of the lines to the spaces) in the X direction. When alignment measurement is taken (FIG. 1), the contrast of the alignment mark image is determined to be:

$$\text{Contrast} = \frac{R_1 - R_2}{R_1 + R_2} \quad (1)$$

Based on the graph 160 and the above formula (1), by selecting appropriate dimensions for the members 142 and 144, the contrast of the alignment mark image can be maximized, thereby improving the alignment measurement accuracy. In one example, the width $W_1$ is designed such that $R_1$ is close to 0.4 with a simultaneous consideration that the ELK material in the spaces 146 help strengthen the alignment mark 114 against pattern deformation as discussed above. Accordingly, the width $W_1$ may be set to about 220 nm. Additionally, the width $W_2$ is designed such that $R_2$ is minimized. In one example, the width $W_2$ may be set to about 80 nm (where $R_2$ is about 0.06). By such a design, the contrast of the image of the alignment mark 114, as captured by the monitor 116 (FIG. 1), is about 0.74.

In various embodiments, the alignment marks 114 may be formed in any one or multiple layers of the wafer 110 for alignment and/or overlay measurement purposes. For example, the alignment marks 114 may be formed in one or more of: an active layer, a contact layer, a passivation layer, a metal layer, and a gate layer. The formation of the alignment marks 114 in a layer of the wafer 110, such as the layer 138, generally involves photolithography, etching, deposition, and/or planarization processes. Further, the alignment mark 114 constructed according to the present disclosure may be formed in masks (such as the mask 126) for alignment purposes.

Although not intended to be limiting, one or more embodiments of the present disclosure provide many benefits to a semiconductor device and a formation process thereof. For example, novel alignment marks constructed according to the present disclosure can withstand impacts of various fabrication stages and at the same time provide high contrast in alignment measurement. Further, the novel alignment marks can be readily integrated into existing semiconductor manufacturing flow.

In one exemplary aspect, the present disclosure is directed to a device (such as a semiconductor wafer) for semiconductor fabrication. The device includes a substrate and a layer formed over the substrate, wherein the layer includes an alignment mark. The alignment mark includes a first plurality of elongated members that are oriented lengthwise along a first direction and are distributed along a second direction. The alignment mark further includes a second plurality of elongated members that are oriented lengthwise along a third direction perpendicular to the first direction and are distributed along the second direction, wherein the second direction is different from each of the first and third directions.

In another exemplary aspect, the present disclosure is directed to a device for semiconductor fabrication. The device includes a substrate and a layer formed over the substrate, wherein the layer includes an alignment mark. The alignment mark includes a first plurality of elongated members that are oriented lengthwise along a first direction and are distributed along a second direction. The alignment mark further includes a second plurality of elongated members that are oriented lengthwise along a third direction perpendicular to the first direction and are distributed along the second direction, wherein the second direction is different from each of the first and third directions. The alignment mark further includes a third plurality of elongated members that are oriented lengthwise along the first direction and are distributed along a fourth direction that is different from each of the first, second, and third directions. The alignment mark further includes a fourth plurality of elongated members that are oriented lengthwise along the third direction and are distributed along the fourth direction.

In yet another exemplary aspect, the present disclosure is directed to a device for semiconductor fabrication. The device includes a semiconductor substrate and a layer formed over the semiconductor substrate, wherein the layer has an alignment mark. The alignment mark includes a first plurality of elongated members that are oriented lengthwise along a first direction and are distributed along a second direction. The alignment mark further includes a second plurality of elongated members that are oriented lengthwise along a third direction perpendicular to the first direction and are distributed along the second direction, wherein the second direction is different from each of the first and third directions. The first and second pluralities of elongated members each include copper. Spaces between each of the first and second pluralities of elongated members are filled with an extreme low-k dielectric material. Each of the first plurality has a first width, each of the second plurality has a second width, and the first width is greater than the second width.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A device for semiconductor fabrication, comprising:
   a substrate; and
   a layer formed over the substrate, the layer having an alignment mark, wherein the alignment mark includes:
     a first plurality of elongated members that are oriented lengthwise along a first direction, wherein middle points of the first plurality of elongated members are distributed along a second direction; and
     a second plurality of elongated members that are oriented lengthwise along a third direction perpendicular to the first direction, wherein middle points of the second plurality of elongated members are distributed along the second direction, wherein the second direction is different from each of the first and third directions.

2. The device of claim 1, wherein the first and second directions form a 45 degree angle.

3. The device of claim 1, further comprising:
   a third plurality of elongated members that are oriented lengthwise along the first direction, wherein middle points of the third plurality of elongated members are distributed along a fourth direction that is different from each of the first, second, and third directions; and
   a fourth plurality of elongated members that are oriented lengthwise along the third direction, wherein middle points of the fourth plurality of elongated members are distributed along the fourth direction.

4. The device of claim 3, wherein the third and fourth directions form a 45 degree angle.

5. The device of claim 3, wherein:
   the first and third pluralities are distributed along two sides of a first triangle and meet at a vertex of the first triangle; and
   the second and fourth pluralities are distributed along two sides of a second triangle and meet at a vertex of the second triangle.

6. The device of claim 1, wherein the first and second pluralities of elongated members are spaced away from each other.

7. The device of claim 1, wherein:
   the first plurality of elongated members are of a same length; and
   the second plurality of elongated members are of a same length.

8. The device of claim 1, wherein:
   the first plurality of elongated members are of a first width;
   the second plurality of elongated members are of a second width; and
   the first width is greater than the second width.

9. The device of claim 1, wherein:
   the middle points of the first plurality are distributed with a first pitch defined in the third direction;
   the middle points of the second plurality are distributed with a second pitch defined in the first direction; and
   the first and second pitches are within 10% of each other.

10. The device of claim 9, wherein:
    each of the first plurality has a first width that is greater than half of the first pitch; and
    each of the second plurality has a second width that is smaller than half of the second pitch.

11. The device of claim 1, wherein the third direction is perpendicular to an electric field of a polarized light beam incident upon the layer during alignment.

12. The device of claim 11, wherein the first and second pluralities of elongated members each include copper.

13. The device of claim 12, wherein spaces between each of the first and second pluralities of elongated members are filled with an extreme low-k dielectric material.

14. The device of claim 13, wherein the alignment mark is disposed in a scribe line region of the device.

15. A device for semiconductor fabrication, comprising:
    a substrate; and
    a layer formed over the substrate, the layer having an alignment mark, wherein the alignment mark includes:
      a first plurality of elongated members that are oriented lengthwise along a first direction, wherein middle points of the first plurality of elongated members are distributed along a second direction;

a second plurality of elongated members that are oriented lengthwise along a third direction perpendicular to the first direction, wherein middle points of the second plurality of elongated members are distributed along the second direction, wherein the second direction is different from each of the first and third directions;

a third plurality of elongated members that are oriented lengthwise along the first direction, wherein middle points of the third plurality of elongated members are distributed along a fourth direction that is different from each of the first, second, and third directions; and a fourth plurality of elongated members that are oriented lengthwise along the third direction, wherein middle points of the fourth plurality of elongated members are distributed along the fourth direction.

16. The device of claim 15, wherein:
the middle points of the first and third pluralities are each distributed with a first pitch defined in the third direction;
the middle points of the second and fourth pluralities are each distributed with a second pitch defined in the first direction; and
the first and second pitches are within 10% of each other.

17. The device of claim 16, wherein:
each of the first and third pluralities has a width that is greater than half of the first pitch; and
each of the second and fourth pluralities has a width that is smaller than half of the second pitch.

18. The device of claim 15, wherein:
the substrate includes a semiconductor; and
the first, second, third, and fourth pluralities of elongated members each include copper.

19. The device of claim 15, wherein:
the first and second directions form a 45 degree angle; and
the third and fourth directions form a 45 degree angle.

20. A device for semiconductor fabrication, comprising:
a semiconductor substrate; and
a layer formed over the semiconductor substrate, the layer having an alignment mark, wherein the alignment mark includes:
a first plurality of elongated members that are oriented lengthwise along a first direction, wherein middle points of the first plurality of elongated members are distributed along a second direction; and
a second plurality of elongated members that are oriented lengthwise along a third direction perpendicular to the first direction, wherein middle points of the second plurality of elongated members are distributed along a fourth direction, wherein each of the second and fourth directions is different from each of the first and third directions and the second direction is substantially parallel to the fourth direction.

* * * * *